(12) United States Patent
Louwsma et al.

(10) Patent No.: US 7,973,693 B2
(45) Date of Patent: Jul. 5, 2011

(54) CIRCUIT WITH A SUCCESSIVE APPROXIMATION ANALOG TO DIGITAL CONVERTER

(75) Inventors: Simon M. Louwsma, Enschede (NL); Maarten Vertregt, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/601,086

(22) PCT Filed: May 27, 2008

(86) PCT No.: PCT/IB2008/052080
§ 371 (c)(1),
(2), (4) Date: Nov. 20, 2009

(87) PCT Pub. No.: WO2008/149259
PCT Pub. Date: Dec. 11, 2008

(65) Prior Publication Data
US 2010/0164778 A1    Jul. 1, 2010

(30) Foreign Application Priority Data

Jun. 6, 2007 (EP) .................................... 07109697

(51) Int. Cl.
*H03M 1/34* (2006.01)
(52) U.S. Cl. ...................................... 341/163; 341/118
(58) Field of Classification Search .................. 341/155, 341/118, 120, 156, 159, 161, 163, 165
See application file for complete search history.

(56) References Cited

U.S. PATENT DOCUMENTS 5,057,841 A * 10/1991 Veerhoek et al. ............. 341/156
6,351,231 B1 * 2/2002 Price et al. ..................... 341/155

FOREIGN PATENT DOCUMENTS

| EP | 406973 A1 | 1/1991 |
| WO | 99/04496 A | 1/1999 |
| WO | 99/55005 A | 10/1999 |

OTHER PUBLICATIONS

Bacrania, Kanti; "A 12-Bit Successive-Approximation-Type ADC With Digitial Error Correction"; IEEE Journal of Solid-State Circuits, vol. SC-21, No. 6; Dec. 1986; pp. 1016-1025.

* cited by examiner

*Primary Examiner* — Joseph Lauture

(57) ABSTRACT

During successive approximation analog to digital conversion a series of successive digital reference values is selected that converges towards a digital representation of an analog input signal. An analog reference signal is generated dependent on the successive digital reference values and compared to the analog input signal. The digital reference values are selected dependent on comparison results. In the selection of the digital reference values successive steps between digital reference values are each selected dependent on values of the comparator result from a plurality of preceding recursion cycles. The comparison results define a series of successively narrower ranges of digital values that contain a digital representation of the analog input signal. Use of a plurality of comparator results for selecting the steps in the digital reference values makes it possible to reduce uncertainty about whether the comparison result has settled. This in turn makes it possible to reduce the sizes of the successive ranges, which speeds up convergence.

9 Claims, 3 Drawing Sheets

CIRCUIT WITH A SUCCESSIVE APPROXIMATION ANALOG TO DIGITAL CONVERTER

FIELD OF THE INVENTION

The invention relates to a circuit with a successive approximation analog to digital converter.

BACKGROUND OF THE INVENTION

A successive approximation analog to digital converter (SA-ADC) is designed to determine a digital representation of an analog input signal value by means of successive recursion cycles. In each recursion cycle a comparison of the analog input signal with a reference value is used to narrow a range of digital values that contains the digital representation of an analog input signal value. In a conventional SA-ADC the analog signal value is each time compared with the middle value of a current range. Dependent on the result of the comparison, the range is then narrowed to the half of the current range that lies above or below this middle value. This form of narrowing is successively repeated for the ranges that are selected in this way. Analog to digital conversion with such a conventional SA-ADC is quite slow. This is because the comparison with the middle value is implemented with a digital to analog converter (DAC) and a comparator, which need to settle to within half the final quantization step before the next range can be selected.

EP406973 describes a method of improving the speed of an SA-ADC. This method uses overlapping half ranges. Instead of selecting from two half ranges above and below the middle value, a selection from three half ranges of the current range is made. The selection is made from half ranges [0,R/2], [R/4,3R/4], [R/2, R], wherein R is the full size of the current range, and the values in the brackets indicate the upper and lower bounds of the range relative to the lower bound of the range. One of these ranges is selected on the basis of comparisons that indicate that the analog signal values lies with certainty in that range.

The advantage of this method stems from the fact that the comparisons need to be performed with less accuracy than in the conventional method. Less settling time is needed to achieve this accuracy. As a result they can be performed more quickly than in the conventional method. To perform the selection from three ranges the analog signal value is compared with two thresholds, between the middle value and one quarter and three quarters of the current range respectively, for example at ⅜th and ⅝th of the current range. Once the DAC and the comparator have settled to within ⅛th of the current range, one of the half ranges can be selected. This form of narrowing is repeated for the successive ranges that are obtained in this way. The digital representation of the analog signal value is formed by adding results of the comparisons.

However, such an SA-ADC method is still slow. The speed may be improved by performing the comparisons with the two thresholds of each recursion cycle in parallel, but this increases circuit area because it requires two comparators. Moreover, it does not reduce power consumption, which depends mainly on the number of comparisons that have to be performed, be they performed in parallel on different comparators or alternately on the same comparator.

SUMMARY OF THE INVENTION

Among others, it is an object to increase the speed and/or to reduce the power consumption of successive approximation analog to digital conversion.

A circuit according to claim 1 is provided. Herein successive approximation analog to digital conversion is performed, wherein reference signals for a comparator are generated under control of a successive digital reference values. The series of digital reference values is made to converge towards a digital representation of the analog input signal. To improve convergence, successive steps between the digital reference values are each selected dependent on values of the comparator output signal from a plurality of preceding recursion cycles. Best convergence can be realized if all successive steps are selected in this way, but an improvement is already realized when at least two successive steps are selected in this way. In an embodiment information derived from the comparator output signals from two immediately preceding recursion cycles is used to select the step.

Thus in contrast to conventional successive approximation analog to digital conversion more comparator output signal values than just the last preceding value of the comparator output signal affect the step. This makes it possible to select digital reference values that converge in fewer steps towards a value that represents the analog input signal.

Because settling of the comparator output signal remains incomplete at the end of a recursion cycle, there is a band of possible analog input signal values that may give rise to uncertain comparator output signal values. In conventional successive approximation analog to digital converters the recursion cycle duration is made so long that this band is below the final quantization accuracy, but in an overlap approach a shorter time is used, which increases the size of the band. The number of steps required for convergence is raised as a result of the size of this band, because the range that is known to contain the analog input signal can be narrowed less quickly of the band of uncertainty is larger.

By using more comparator output signal values to select successive steps in the digital reference value it is made possible to achieve a reduction of the band of uncertain values without increasing the duration of the recursion cycles, so that it is possible to reduce the number of steps required for convergence as well. In an example it is assumed that the analog reference signal of the comparator settles exponentially. In this case the band of uncertainty can be reduced when the direction is known from which side the analog reference signal settles towards its final value. This depends on whether successive steps are in the same direction or not. Using this information the band of uncertainty can be reduced, and accordingly the narrowing factor by which the ranges are reduced can be reduced as well.

In an embodiment the control circuit is configured to select successively narrowed ranges of digital values in successive ones of the recursion cycles, each range containing a digital value that represents an analog input signal value from the signal input. The control circuit narrows the ranges successively by a narrowing factor between one half and one. Thus each comparison results in additional convergence. The same or different factors may be used for different recursion cycles. The digital reference value for each recursion cycle and the digital reference value for the previous recursion cycle are selected on opposite sides with respect to a midpoint of the range for the recursion cycle. Thus it is ensured that at least one range can be selected wherein the analog input signal certainly lies.

In an embodiment the size of each step is equal to a square of one minus the narrowing factor or a square of the narrowing factor, up to at most a rounding error, when the comparator output signals have for the preceding two recursion cycles have the same value or different values respectively.

The technique can be applied to analog to digital conversion with a single bit or a multi-bit comparator. With a multi-bit comparator the range of possible analog input signal values can be narrowed more rigorously in each recursion cycle.

BRIEF DESCRIPTION OF THE DRAWINGS

These and other objects and advantageous aspects will become apparent from a description of exemplary embodiments, using the following Figures.

DESCRIPTION OF EXEMPLARY EMBODIMENTS

Figure 1:
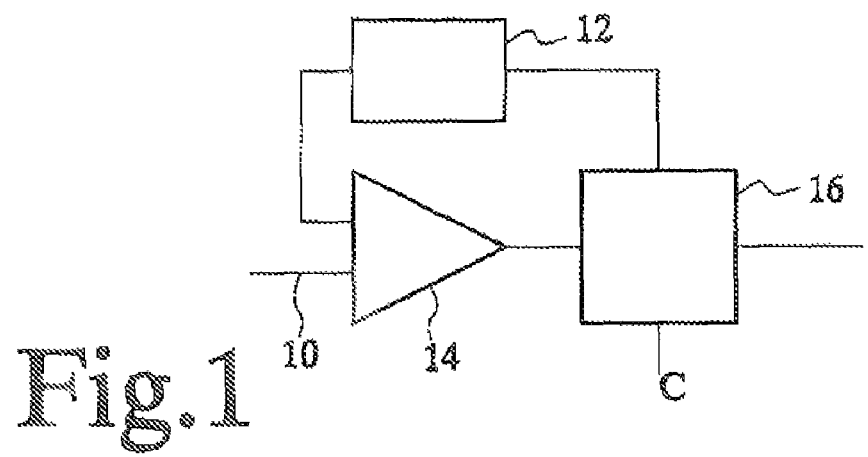
FIG. 1 shows an analog to digital conversion circuit

FIG. 1 shows an analog to digital conversion circuit with a signal input 10, a reference voltage generator 12, a comparator 14 and a control circuit 16. Comparator 14 has first and inputs coupled to signal input 10 and a reference voltage output of reference voltage generator 12 respectively. Comparator 14 has a comparator output coupled to an input of control circuit 16. Control circuit 16 a first output coupled to a control input of reference voltage generator 12. Reference voltage generator 12 may be implemented using any type of digital to analog conversion circuit. Furthermore, control circuit 16 has a clock signal input C and a second output that forms an output of the analog to digital conversion circuit. Alternatively, the first output may be used as second output.

In operation an input signal is applied to signal input 10. Preferably, a sample and hold circuit (not shown) is provided which has an output that supplies the input signal to signal input 10. Comparator 14 compares the input signal to a reference signal from reference voltage generator 12. Control circuit 16 receives a comparator signal that results from the comparison.

In successive cycles signaled by a clock signal on clock signal input C, control circuit 16 uses the comparator output signal to select successive reference values (threshold values) for comparison with the analog input signal values. Dependent on the selected reference value, control circuit 16 supplies a digital reference value to reference voltage generator 12. Reference voltage generator 12 functions as a digital to analog converter. It responds to the digital reference value by driving the analog signal at the second input of comparator 14 to an analog reference signal level corresponding to the digital reference value.

Successive approximation analog to digital conversion uses measurement based selection of successively narrower ranges in which the analog input signal is known to lie. The speed of this form of analog to digital conversion is a function of the number of successive ranges that are needed and the time needed for the measurements to select each range. The measurements to select the ranges involve the output of a series of digital reference values from control circuit 16 to reference voltage generator 12 to define the reference signals with which the analog input signal should be compared.

Conceptually, the digital reference values are selected dependent on the currently selected ranges. In practice this results in a series of digital reference values T(n) that converges towards a digital representation of the analog input signal in successive recursion cycles, which are labeled by n. (n=0, 1, 2 etc. successively). The speed of analog to digital conversion is improved and power consumption is reduced when the speed of convergence of the series of digital reference values T(n) is improved. By careful selection of the digital reference values T(n) the speed of convergence can be optimized. That is, the reduction of the size of the range per comparison can be improved.

Control circuit 16 improves convergence of the series of digital reference values T(n) by selecting the steps in the digital reference values T(n) dependent on a plurality of previous comparator output signals D(n). Conventionally, each comparator output signal D(n) is used to select only one step T(n+1)−T(n) in the digital reference values. By using a comparator output signal in a way in which they affect more than one subsequent step in the digital reference value, convergence of the series of digital reference values T(n) can be improved.

In a simple example control circuit 16 selects the digital reference values according to $T(n+1)=T(n)-R(n)*(1-f)*(1-f)$ if $D(n-1)=0$ and $D(n)=0$ $T(n+1)=T(n)-R(n)*f*f$ if $D(n-1)=1$ and $D(n)=0$ $T(n+1)=T(n)+R(n)*f*f$ if $D(n-1)=0$ and $D(n)=1$ $T(n+1)=T(n)+R(n)*(1-f)*(1-f)$ if $D(n-1)=1$ and $D(n)=1$ Herein and f is a range reduction factor, which is greater than one half and less than one, R(n) is the size of a current range and D(n) represents a result of the comparison by comparator 12, D(n) being one or zero when comparator 14 indicates that the analog input signal was above or below the signal supplied by reference voltage generator 12 respectively. As may be noted the most recent comparator result D(n) determines the direction of the step T(n+1)−T(n). The size of step T(n+1)−T(n) depends on whether D(n) and D(n−1) are the same, the size is f*f if $D(n)$ and D(n−1) differ and (1−f)*(1−f), i.e. smaller, if $D(n)$ and D(n−1) are the same.

The size of the current range changes in successive cycles, according to $R(n+1)=f*R(n)$, or $R(n)=R(0)*f^n$ Thus, f represents a narrowing factor, by which the range is reduced in each recursion cycle.

Figure 2A:
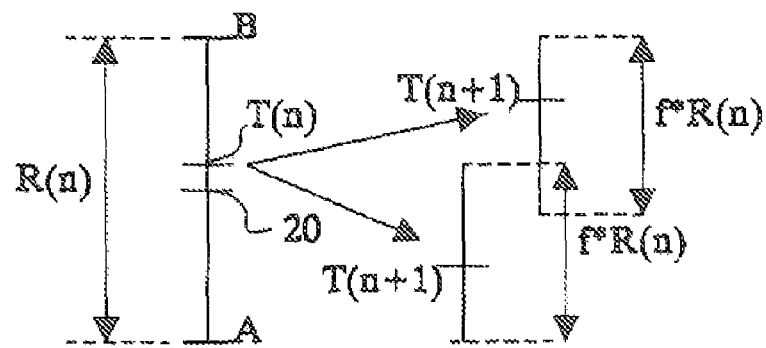
FIGS. 2a.b illustrate digital reference values
Figure 2B:
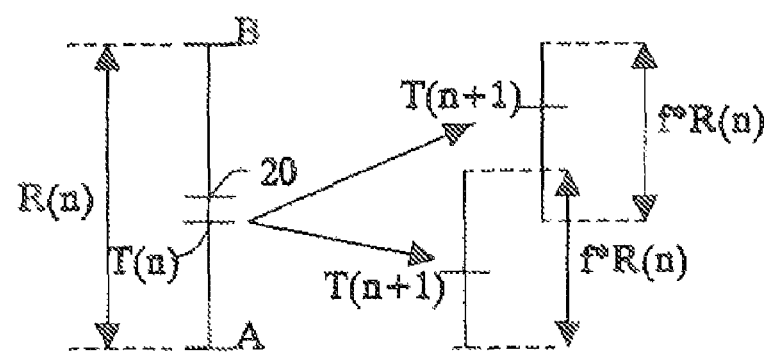

FIGS. 2a, b illustrate reference value levels T(n) and T(n+1). A current range running from signal levels A to B is shown, with a range size R=B−A. The reference level T(n) can be above or below the midway value of this range, dependent on previous recursion cycles. In the case of FIG. 2a the digital reference value T(n) lies at f*R above the lower bound A of the range. Because f is above one half, T(n) lies above the level 20 midway in the range from A to B. In the case of FIG. 2b the digital reference value T(n) lies at (1−f)*R above the lower bound A of the range, i.e. below the level 20 midway in the range from A to B.

In the next recursion cycle control circuit 16 sets the digital reference value T(n+1) to one of two values, dependent on the comparator output signal according to the recursion described above. As shown, the possible digital reference values T(n+1) lie in respective new ranges of size f*R, above the midway level in the new range when the upper range is selected and below the midway level in the new range, when the lower range is selected.

This method narrows the size R(n) of the range of values in which the analog input signal must lie after each comparison. This is also the case in conventional successive approximation analog to digital converters, where the range is reduced by a factor f=½ in each recursion cycle, which is only the possible if the recursion cycles are sufficiently long to allow the input signal at the second input of comparator 14 to settle within half the overall analog to digital conversion accuracy, or if a plurality of comparisons is used.

The present control circuit 16 works with short recursion cycles that do not achieve settling to within final quantization accuracy in each cycle. To compensate for the higher inaccuracy, the range reduction factor f is larger than one half. Moreover the digital reference value T(n) is not placed at the midway level of the current range but at an overcompensated position, on the opposite side of the midway level relative to the previous digital reference value T(n−1). The distance to the midway level is selected so that the comparator output is ensured to settle within the recursion cycle if the analog signal input is within (1−f)*R(n) of the previous digital reference value T(n−1).

This method makes use of that assumption that the range of analog input signal values can be distinguished into three parts: analog input signal values in two of these parts result in known comparator output signals, and analog input signal values in a third part, which will be called the overlap band, may result in either possible comparator output signal value, due to uncertainty about settling. The position of the overlap band depends on the direction of change of the digital reference value. Typically the signal at the second input of the comparator will be on a known side of the level represented by the reference value T(n). This occurs for example when the signal at the second input of the comparator settles through a resistor-capacitor circuit (RC-circuit). This means that only analog input signals in the overlap band on one side of the level represented by the reference value T(n) can result in two possible comparator output signals. The new ranges are selected so that they both contain the overlap band.

This method of selecting T(n+1) allows the series of digital reference values T(n) to converge to a value representing the analog input signal as a function of the recursion cycle number n. Convergence is ensured as long as the comparator output will have settled to within the assumed overlap band, which is used to select the digital reference values. Less time will be needed to ensure this when the factor f is selected larger. Therefore the recursion cycle duration may be lowered when the factor f is selected larger.

In a more specific mathematical description, in each recursion cycle it is assumed that the digital input signal lies within a current range from A(n) to A(n)+R(n). The reference level may be at T(n)=A(n)+f*R(n) or T(n)=A(n)+(1−f)*R(n), dependent the previous direction of change of the reference level. The new range is selected dependent on the comparator output signal D(n) in response to this reference level, as the range from A(n) to A(n)+f*R(n) or the rang from A(n)+(1−f)*R(n) to A(n)+R(n). This means that $$A(n+1)=A(n)+D(n)*R(n)*(1-f)$$

and $$R(n+1)=f*R(n)$$

The relative position of new the digital reference value T(n+1) is selected dependent on the previous comparator output signal:

$$T(n+1)=A(n+1)+f*R(n+1) \text{ if } D(n)=1$$

$$T(n+1)=A(n+1)+(1-f)*R(n+1) \text{ if } D(n)=0$$

That is, the new digital reference value is selected above the midway level of the new range if the upper alternative for the new range is selected and below the midway level of the new range if the lower alternative for the new range is selected. In the first case the signal at the second input of comparator 14 will rise and in the second case it will drop. The reference values are selected so that they are in the upper or lower half of the new range, when the reference level rises and drops respectively.

The lower bounds A(n), A(n+1) of the ranges are only used for the sake of exposition. They need no be used explicitly to determine the digital reference values T(n). The lower bounds A(n) can be expressed in terms of the digital reference values:

$$A(n)=T(n)-R(n)*f \text{ if } D(n-1)=1$$

$$A(n)=T(n)-R(n)*(1-f) \text{ if } D(n-1)=0$$

By means of this expression the recursion relation for the digital reference value T(n) can be expressed without reference to the lower bound, including terms corresponding the distance to the lower bound in successive cycles and the change in the lower bound:

$$T(n+1)=T(n)-(1-f)*R(n)+(1-f)*R(n+1) \text{ if } D(n-1)=0 \text{ and } D(n)=0$$

$$T(n+1)=T(n)-f*R(n)+(1-f)*R(n+1) \text{ if } D(n-1)=1 \text{ and } D(n)=0$$

$$T(n+1)=T(n)-(1-f)*R(n)+f*R(n+1)+R(n)*(1-f) \text{ if } D(n-1)=0 \text{ and } D(n)=1$$

$$T(n+1)=T(n)-f*R(n)+f*R(n+1)+R(n)*(1-f) \text{ if } D(n-1)=1 \text{ and } D(n)=1$$

Using the fact that R(n+1)=f*R(n) this results in the following recursion relation for the digital reference level.

$$T(n+1)=T(n)-R(n)*(1-f)*(1-f) \text{ if } D(n-1)=0 \text{ and } D(n)=0$$

$$T(n+1)=T(n)-R(n)*f*f \text{ if } D(n-1)=1 \text{ and } D(n)=0$$

$$T(n+1)=T(n)+R(n)*f*f \text{ if } D(n-1)=0 \text{ and } D(n)=1$$

$$T(n+1)=T(n)+R(n)*(1-f)*(1-f) \text{ if } D(n-1)=1 \text{ and } D(n)=1$$

The factor f may be selected to optimize speed of the circuit. As noted there is a relation between the minimum possible factor f and the minimum recursion cycle duration. Furthermore, the time needed for analog to digital conversion is the product of the recursion cycle duration and the number of recursion cycles needed for convergence. If settling of the signal at the second input of comparator 14 occurs exponentially, the minimum duration of a recursion cycle decreases approximately proportional to −log(2*f−1) with increasing factor f. The number N of cycles needed to reach a predetermined analog to digital conversion accuracy corresponds to reaching a range size $R(N)=R(0) f^N$ equal to that accuracy. Therefore, the required number of cycles increases approximately in proportion to log(f) when the factor f increases. In an optimal selection these two effects are balanced. In practice an optimal value of the factor may be selected by analytic calculation, experimentally, or by simulation.

It should be noted that an embodiment has been illustrated wherein the same factor f has been used to set the digital reference values and to control the size of the successive ranges in each recursion cycle. This is not necessary. Different factors may be used, so that T(n)=A(n)+f1*R(n) or A(n)+(1−f1)*R(n) and R(n+1)=f2*R2, where f2 is greater than f1. Similarly, different factors for f1 and f2 may be used in different recursion cycles, or different factors for f1 and f2 may be used dependent on whether the digital reference value is to be raised or lowered. In general any relation of the following type may be used $$A(n+1)=A(n)+D(n)*R(n)*(1-fa)$$

$$R(n+1)=fa*R(n)$$

$$T(n+1)=A(n+1)+fb*R(n+1) \text{ if } D(n)=1$$

$$T(n+1)=A(n+1)+(1-fc)*R(n+1) \text{ if } D(n)=0$$

Herein the factors fa, fb, and fc may depend on the recursion cycle and measurements like the D(n) values, each lying between one half and one, fa in each cycle being greater than fb or fc in the previous cycle, whichever was used and the cycle duration being sufficient to allow sufficient settling to remove uncertainty whether the analog input signal is in the selected range. The latter may be verified at the design stage by calculation experimentally, or by simulation.

It only matters that the next range encompasses both analog input signal values that certainly lead to the detected comparator output signal and analog input signal values for which the comparator output signal may not have settled. The factors may be adapted for example to provide for rounding or to simplify the determination of the digital reference value.

For reference it may be noted that the operation of conventional successive approximation analog to digital converters may be cast in the same mathematical description:

$$T(n)=A(n)+R(n)/2$$

$$A(n+1)=A(n)+D(n)*R(n)/2$$

$$R(n+1)=R(n)/2$$

so that $$T(n+1)=T(n)+D(n)*R(n)/2-R(n)/4$$

Herein the step $T(n+1)-T(n)$ depends only on one comparator output signal D(n). Basically, only the direction of the step is determined by the comparator output signal D(n) and is its size is fixed $(R(n)/4)$ In an overlap successive approximation analog to digital converter two series of digital reference values Ta(n) and Tb(n) are used to produce two comparator results:

$$Ta(n)=A(n)+3*R(n)/8 \quad Ta(n)=A(n)+5*R(n)/8$$

$$A(n+1)=A(n)+(Da(n)+Db(n))*R(n)/4$$

$$R(n+1)=R(n)/2$$

so that $$Ta(n+1)=Ta(n)+(Da(n)+Db(n))*R(n)/4-3*R(n)/16$$

$$Tb(n+1)=Tb(n)+(Da(n)+Db(n))*R(n)/4-5*R(n)/16$$

Herein the comparator results affect the step in the digital reference values only in the next recursion cycle, or, if the step between the two thresholds in one recursion cycle is considered, that step does not depend on comparator results at all.

Although a specific mathematical formula has been given to describe the determination of the digital reference values T(n), it should be noted that in practice various alternative methods can be used to determine the digital reference values T(n). For example, control circuit 16 may be configured to compute the steps $T(n+1)-T(n)$ explicitly, or it may compute the digital reference values T(n) directly, by performing the mathematical operations of the recursion relation for T(n). Alternatively, control circuit 16 may update values for the lower bound A(n) and/or the upper bound B(n) and compute the digital reference values T(n) from one or both of these values. Any other computation that results in the same, or substantially the same the digital reference values T(n) may be used.

Any computation circuit may be used for this purpose in the control circuit, such as a correspondingly programmed processor, or a hardwired computation circuit that is dedicated to computing indications of the digital reference values, which makes it possible to perform very high speed analog to digital conversion.

Figure 3:
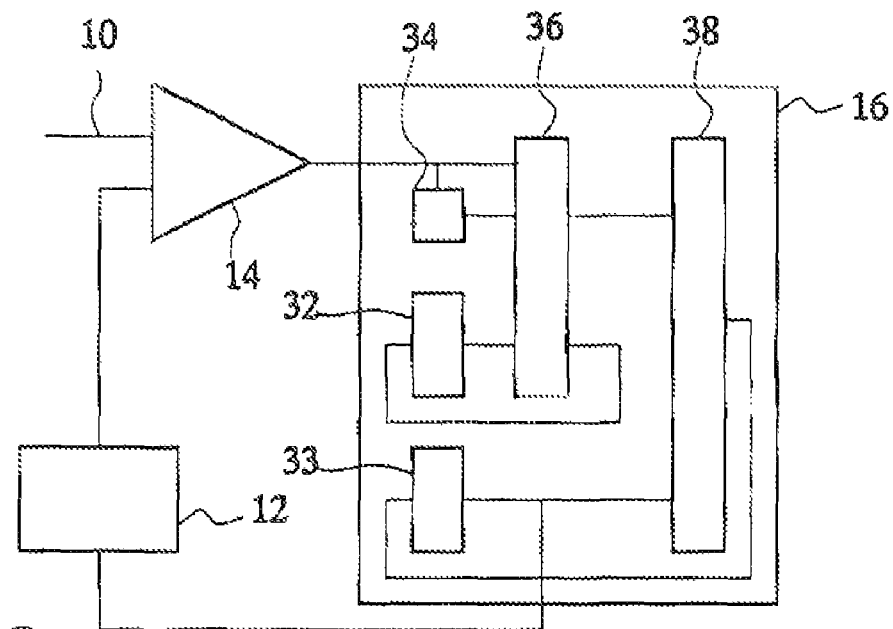
FIGS. 3-5 show analog to digital conversion circuits

FIG. 3 shows an embodiment wherein a look-up circuit is used to determine the digital reference values T(n). The look-up circuit comprises registers 32, 33 for storing R(n) and T(n) values and a register 34 for storing a previous comparator output signal value D(n). A look-up memory 36 is provided that receives R(n), D(n−1) and D(n) and returns R(n+1) and a step value for the digital reference value T(n). Instead of a look-up memory 36 any other look-up table circuit may be used, for example a logic circuit that is hardwired to produce the looked-up values. An adder 38 is provided for adding the increment value to the digital reference values T(n), resulting in T(n+1). It may be noted that instead of R(n) the cycle number n may be used as an input to the look-up memory when there is a predetermined relation between the cycle number n and R(n). In this case, register 32 may be a counter, look-up memory 36 merely needs to output the step value. As an alternative a look-up table may be used that uses T(n), R(n) or n, D(n−1) and D(n) as inputs and returns T(n+1) and optionally R(n+1). Instead Any other values, such as A(n), may be used from which T(n+1) may be computed. The information about D(n−1) and D(n) could be implicit in such values.

Figure 4:
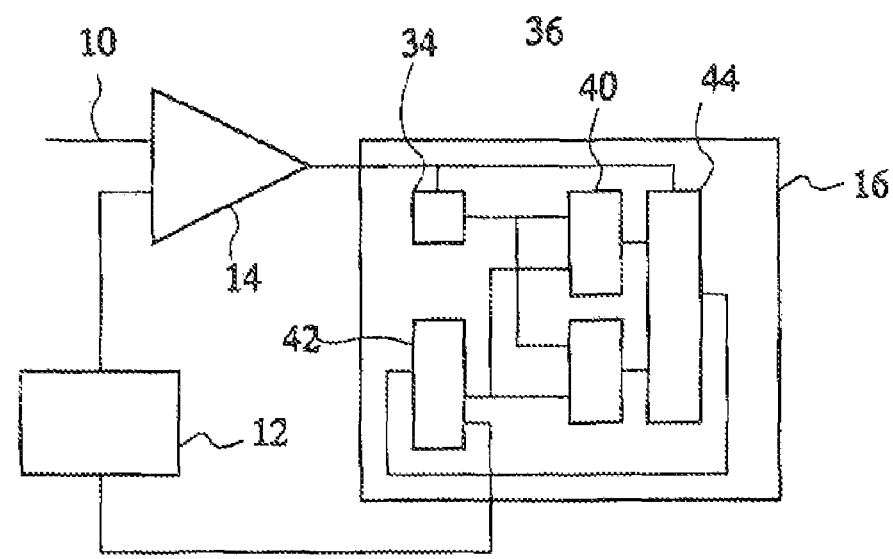

FIG. 4 shows an alternative embodiment wherein control circuit 16 comprises two digital reference value determination circuits 40 in parallel, a state register 42 and a multiplexer 44. Digital reference value determination circuits 40 have inputs coupled to outputs of state register 42 and outputs coupled to inputs of multiplexer 44. The comparator output of comparator 14 is coupled to a control input of multiplexer 44. Multiplexer 44 has an output coupled to state register 42, which has an output coupled to the control input of reference value generator 12. In operation, digital reference value determination circuits 40 determine the two possible digital reference values respectively and multiplexer selects one of the two possible digital reference values dependent on the comparator output signal.

The previous embodiment relate to a simple example wherein a signal D(n) at the comparator output affects two steps $T(n+1)-T(n)$, $T(n+2)-T(n)$ in the digital reference value, with the effect that the speed of convergence of the series of digital reference values T(n) is improved. As may be appreciated such an improvement is already realized if the signal D(n) for one or two recursion cycles n is used in this way. More improvement is realized when signals from more recursion cycles are used in this way. However the gain is larger when R(n) is larger. Hence the largest gain is achieved when at least the earlier recursion cycles are handled in this way.

Furthermore, it may be noted that further improvements may be realized when the steps in the digital reference values T(n) are selected so that signals D(m) from more than two recursion cycles m affect the selection. This can be used to reduce the range size reduction factor f. As noted the minimum allowable value of the range size reduction factor f is determined by the size of the uncertainty band at the end of the recursion cycle. The narrowed range of the next recursion cycle should include those analog input values that could lead to either comparator output signal value D(n), i.e. analog input values from the uncertainty band. If the size of the uncertainty band can be reduced the range size reduction factor can be lowered, with the result that convergence of the series of digital reference values T(n) is speeded up.

The size of the uncertain range can be reduced by more accurate prediction of the current signal level at the second input of comparator 14 at the end of the recursion cycle. A series of previous comparator output signals D(m) (m=n-1, . . . ) may be used to predict this current signal level. When more comparator output signals D(m) are used the prediction can be improved.

The prediction and the remaining uncertainty band may be determined at the design stage, by simulating circuit operation and its possible spread for each possible series of previous comparator output signals D(m) (m=n-1, . . . ) that may occur previous to a recursion cycle n and determining the resulting signal levels produced at the second input of comparator 14 after each series for various possible digital reference values T(n). From this, reference values T(n) may be selected as a function of the previous comparator output signals D(m). By comparing the effect of different reference values T(n) and selecting one that reduces or minimizes the uncertainty band, convergence can be improved. The range size reduction factor f can then be selected according to the size of the uncertainty band. After such a selection control circuit 16 (e.g. the lookup table) may be configured to produce the selected digital reference values in dependence on the series of previous comparator output signals D(m).

Figure 5:
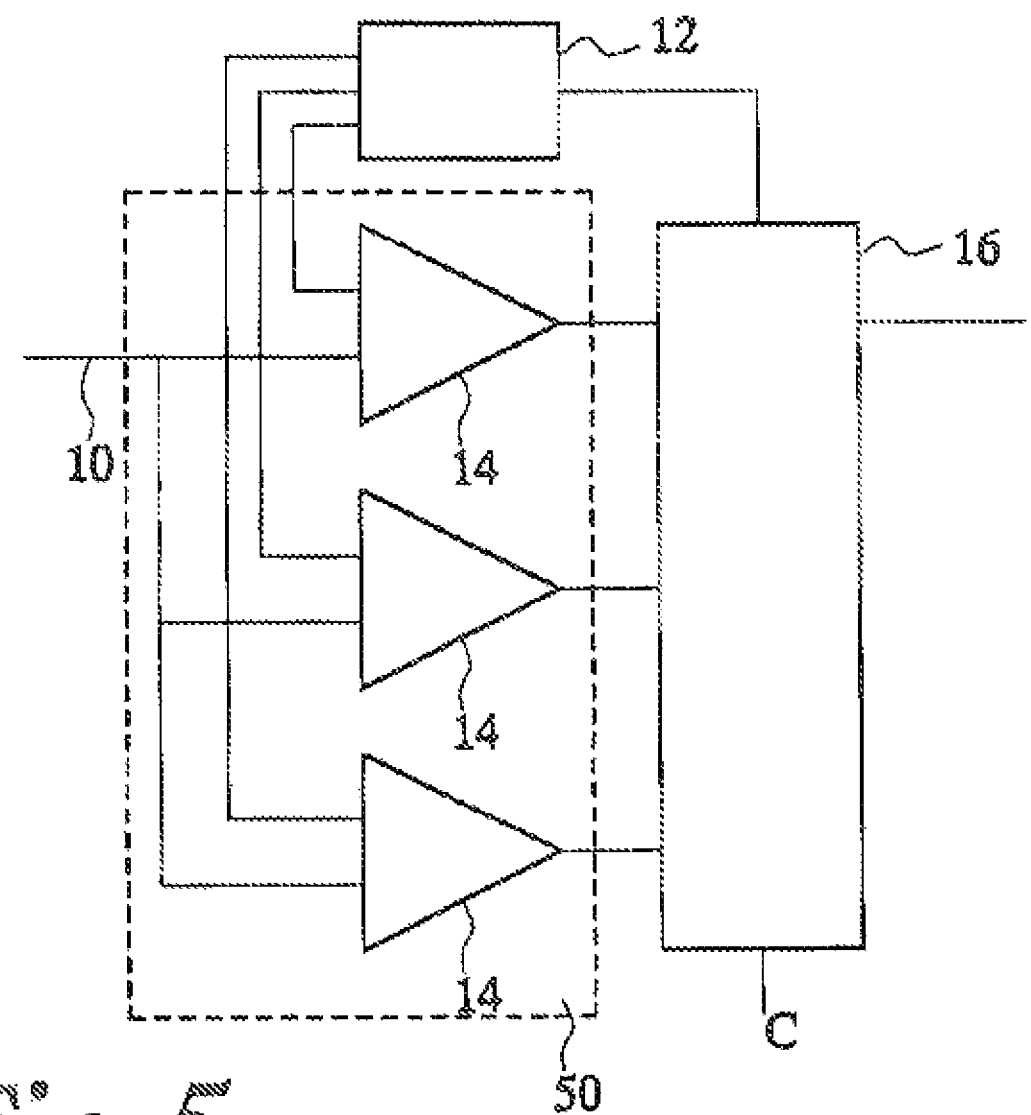

FIG. 5 shows an embodiment wherein a multi-bit output comparator 50 is used, comprising plurality of single bit output comparators 12, to control operation of control circuit 16. By way of example a three-bit output comparator 50 is shown with three single comparators 12, but a different number may be used. Analog signal input 10 is coupled to first inputs of comparators 14. Reference signal generator 14 has a plurality of outputs, coupled to second inputs of the comparators 14 respectively. Comparators 14 have comparator outputs coupled to control circuit 16.

Successive approximation AD converters with multi-bit comparators are known per se. Conventionally, they select between N ranges if N-1 comparators are used. This is repeated in successive recursion cycles, one next range being selected from N sub-ranges of the range of the previous recursion cycle, on the basis of comparison with signals generated under control of digital reference values. As this is known, it will not be described in detail. In the present case the control circuit 16 selects the steps in the digital reference values dependent on comparator output signals from a plurality of previous recursion cycles.

Control circuit 16 is configured for example to select a series of sets of digital reference values T1($n$), T2($n$), T3($n$). Selection may be performed indirectly by selecting one digital reference value and deriving the others from it, or by directly selecting each of the values. The selection of the digital reference values T1($n$), T2($n$), T3($n$) is based on the scheme described above. For example a current range may be notionally divided by evenly spaced levels at ¼, ½ and ¾ of the range. The digital reference values T1($n$), T2($n$), T3($n$) are not set at these levels, but at an overshoot, opposite the current reference values relative to respective ones of these evenly spaced levels. The overshoot distances from the evenly divided levels are based on the achievable range size reduction per recursion cycle, i.e. on the band of uncertainty that has been determined to remain at the end of the recursion cycle. A selection of the comparator outputs is made that will be used to select the steps in the digital reference values T1($n$), T2($n$), T3($n$), the uncertainty band left by such a selection is determined at the design stage and the range narrowing factor is set correspondingly. Comparator output signals from a plurality of preceding recursion cycles are used to select a step, so that the band of uncertainty is reduced.

In operation, the control circuit selects the steps in the digital reference values T1($n$), T2($n$), T3($n$) dependent on comparator output signals from a plurality of preceding recursion cycles. The multi-bit comparator compares the resulting analog reference signals with the analog input signal and signals the result to the control circuit, which uses this information in the selection of new digital reference values and so on.

Typically, the various signals in the disclosed circuits will be voltages at circuit nodes. Thus for example the analog input signal may be a voltage and the analog reference signal may be a voltage, the comparator comparing these voltages. Alternatively, currents may be used as signals at selected locations or everywhere in the circuit. Thus, for example, the comparator may compare currents, which may reduce the band of uncertainty.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit comprising a successive approximation analog to digital converter, comprising:
    a signal input for receiving an analog input signal;
    a reference signal generator having a control input and an analog reference signal output;
    a comparator having a first and second comparator input, coupled to the signal input and the analog reference signal output respectively, and a comparator output for supplying a comparator output signal; and
    a control circuit having an input coupled to the comparator output and a control output coupled to the control input of the reference voltage generator, the control circuit being configured to indicate a series of digital reference values at the control input of the reference signal generator in successive recursion cycles, with steps between successive digital reference values, wherein the control circuit is configured for selecting successive ones of the steps, such that each step comprises a step size dependent on values of the comparator output signal from a plurality of preceding recursion cycles.

2. A circuit according to claim 1, wherein the control circuit is configured to select the successive ones of the steps each dependent on values of the comparator output signal from two recursion cycles that immediately precede the step.

3. A circuit according to claim 1, wherein the control circuit is configured to select successively narrowed ranges of digital values in successive ones of the recursion cycles, each range containing a digital value that represents the analog input signal, the control circuit narrowing the ranges successively by a narrowing factor or factors between one half and one, the digital reference value for each recursion cycle being selected from the range for the recursion cycle, lying opposite to the digital reference value for the previous recursion cycle with respect to a midpoint of the range for the recursion cycle, with a distance to that midpoint that is less than or equal to the range size times a difference between said narrowing factor of the recursion cycle and one half.

4. A circuit according to claim 1, wherein the control circuit is configured to make the size of each step equal to a square of one minus a narrowing factor or a square of the narrowing factor, up to at most a rounding error, when the comparator output signals for the preceding two recursion cycles have the same value or different values respectively, the narrowing factor lying between one half and one.

5. A circuit according to claim 1, wherein the comparator is configured to produce a comparison of the analog input signal with a first number of levels, the first number defining a resolution factor that is the inverse of the first number plus one, the control circuit being configured to select successively narrowed ranges of digital values in successive ones of the recursion cycles, each range containing a digital value that represents an analog input signal value from the signal input, the control circuit narrowing the ranges successively by a narrowing factor or factors having a value between the resolution factor and one, the digital reference value for each recursion cycle being selected in the range for the recursion cycle, lying opposite to the digital reference value for the previous recursion cycle with respect to a point at an integer number of times the resolution factor times the size of the range for the recursion cycle, with a distance to that point that is less than the range size times a difference between said narrowing factor for the recursion cycle and the resolution factor.

6. A circuit according to claim 1, wherein the control circuit comprises a lookup table circuit, configured to look-up information indicating the successive one of the steps or the digital reference values realized with the steps, the look-up being performed dependent on information that is derived from the comparator output signal from at least two preceding ones of the recursion cycles.

7. A circuit according to claim 1, wherein the comparator indicates a direction from a signal at second comparator input to the analog input signal, the control circuit is configured to select the successive ones of the steps each in the direction indicated by the comparator output signal in an immediately preceding recursion cycle, with a step size dependent on the comparator output signal from a further preceding recursion cycle.

8. A circuit according to claim 7, wherein the control circuit is configured to use a relatively smaller or larger step size when the directions in successive cycles are the same or opposite, respectively.

9. A successive approximation analog to digital conversion method, comprising:
receiving an analog input signal;
selecting a series of successive digital reference values that converge towards a digital representation of the analog input signal;
generating an analog reference signal dependent on the successive digital reference values;
comparing the analog reference signal with the analog input signal; and
selecting steps between successive digital reference values wherein each step comprises a step size dependent on values of the comparator output signal from a plurality of preceding recursion cycles.

* * * * *